United States Patent [19]

Whitley

[11] Patent Number: 4,763,701
[45] Date of Patent: Aug. 16, 1988

[54] COMPONENT LEAD BENDING DEVICE

[75] Inventor: George J. Whitley, Philadelphia, Pa.

[73] Assignee: General Electric Company, Schenectady, N.Y.

[21] Appl. No.: 43,122

[22] Filed: Apr. 27, 1987

[51] Int. Cl.$^4$ .............................................. B21F 45/00
[52] U.S. Cl. ...................................... 140/105; 29/741
[58] Field of Search ................ 140/93 D, 105; 29/741

[56] References Cited

U.S. PATENT DOCUMENTS

| | | | |
|---|---|---|---|
| 4,377,026 | 3/1983 | Whitley | 29/564.1 |
| 4,462,435 | 7/1984 | Whitley | 140/105 |
| 4,464,829 | 8/1984 | Whitley et al. | 29/741 |
| 4,513,493 | 4/1985 | Whitley et al. | 29/566.3 |
| 4,520,549 | 6/1985 | Whitley et al. | 29/566.3 |
| 4,557,043 | 12/1985 | Starski | 29/741 |
| 4,557,044 | 12/1985 | Crowman et al. | 140/105 |
| 4,561,166 | 12/1985 | Whitley | 29/566.3 |
| 4,569,127 | 2/1986 | Whitley | 29/741 |
| 4,590,660 | 5/1986 | Starski | 29/566.3 |
| 4,620,572 | 11/1986 | Baker et al. | 140/105 |

FOREIGN PATENT DOCUMENTS 1364528  8/1974  United Kingdom .................. 29/741

*Primary Examiner*—Lowell A. Larson
*Attorney, Agent, or Firm*—William Squire; James C. Davis, Jr.; Paul R. Webb, II

[57] ABSTRACT

A plurality of closely-spaced components on a substrate have their leads bent simultaneously to secure the components to the substrate. Two air cylinders are secured at opposite ends of a stationary plate. One cylinder displaces a first plate in opposite linear directions. The other cylinder displaces a second plate in the same directions as the first plate but opposite in sense. An array of lead bending jaws are secured to each movable plate in mating pairs for bending the leads of a corresponding component, one jaw of the pair is secured to and moved by one plate and the other jaw of the pair is secured to and moved by the other plate.

13 Claims, 5 Drawing Sheets

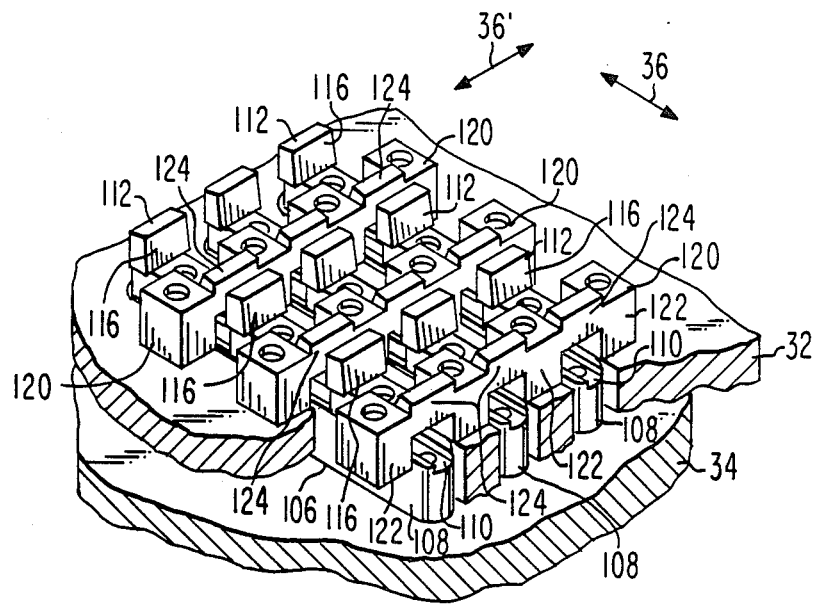
Fig. 7
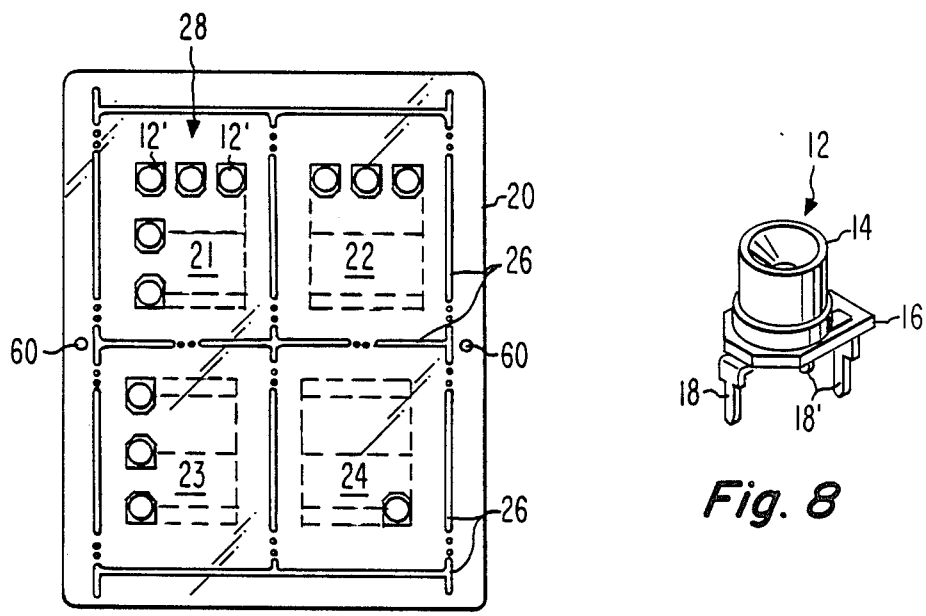
Fig. 9
Fig. 8

COMPONENT LEAD BENDING DEVICE

The present invention relates to component lead bending devices, and more particularly, to devices which bend component leads to secure a component to a printed circuit board or other substrate.

Of interest are U.S. Pat. Nos. 4,520,549; 4,557,043; 4,569,127; 4,464,829; 4,513,493; 4,462,435; 4,561,166; 4,377,026 and 4,590,660.

Devices for bending the leads of components, for example, electrical components, for attachment to a substrate such as printed circuit boards are in wide use. For example, see several of the U.S. Patents mentioned above. Many of the structures illustrated in the above-noted patents have a number of elements in common. For example, i.n U.S. Pat. No. 4,520,549 a multiple component lead processing apparatus is disclosed. In FIGS. 1, 2 and 3 a mechanism is disclosed comprising a fixed plate and a moveable plate which operate a lead processing device. Lead processing devices include a head assembly comprising two elements in which one element is fixed in place and the second element includes a rotatable member having a shaft rotatably secured to the fixed element. A printed circuit board is aligned relative to the lead processing device by alignment pins. The rotatable element is rotatably driven by a lever coupled to the moveable plate. The moveable plate displaces back and forth in opposite directions to impart simultaneous rotary motion to all of the moveable elements in all head assemblies.

In U.S. Pat. No. 4,462,435, there is disclosed an apparatus which is used with the system of U.S. Pat. No. 4,520,549. A device is disclosed for securing a component, such as a transformer, to a printed circuit board. The leads of the transformer are tab-like and are bent by a pair of jaws which move back and forth in opposite linear directions as illustrated in FIG. 6 thereof. The jaws, however, are activated by a rotatable disc-like camming member whose shaft is driven by a lever in somewhat similar manner as the rotary lead processing element of U.S. Pat. No. 4,520,549. Other of the patents mentioned above of interest also use a lever arrangement similar to the one described for rotatably operating the moveable elements thereof.

Another system disclosed in U.S. Pat. No. 4,590,660 for processing closely spaced component leads includes a pair of pistons which displace a lead processing member in sliding engagement with fixed elements of the piston housing. This system, like the lever systems mentioned above, however, can take up a relatively large amount of space relative to the size of the component being processed. For example, in the lever arrangement disclosed in U.S. Pat. No. 4,462,435, as seen in FIG. 5 thereof, the lever extends beyond the metes and bounds of the head portions which engage the component leads.

In some electronic systems there sometimes occurs a closely spaced array of components whose leads need to be bent. Further, in some manufacturing techniques printed circuit boards are employed in multiples of a given circuit design. The boards are manufactured with dink lines so that they may be fractured into modules in a known way. For example, in one instance, there is a circuit board module structure comprising nine potentiometers located on one-half inch center-to-center spacings in one direction and on three-quarter inch spacings in a second orthogonal direction. The board comprises four such modules and therefore has 36 potentiometers whose leads need to be bent. It is also desirable to bend the leads of all of the potentiometers simultaneously. It is relatively difficult to implement the lever drive technology of the prior-disclosed systems with such an array of electrical components.

A component lead bending apparatus according to the present invention comprises a support and a first plate moveably secured to the support for reciprocation in first directions. A second plate is moveably secured to the support for reciprocation in the first directions. The first plate has an opening therethrough. A first jaw is secured to the second plate and is located in the opening. The second jaw is secured to the first plate aligned with and facing the first jaw in the first directions. Actuating means are coupled to first and second plates and are secured to the support for selectively moving the plates and jaws in one of the first directions toward one another and then in directions away from one another to thereby bend the leads of a component. By placing the first jaw on one plate and a second jaw on a second plate, a plurality of jaws in a closely-spaced array may be employed for bending leads of closely-spaced components.

In the drawings:

FIG. 7 is an isometric view of the embodiment of FIG. 1 illustrating a subarray of jaws for bending the leads of a component on one module of a multimodule printed circuit board;

FIG. 8 is an isometric view of a typical component assembled by the apparatus of the embodiment of FIG. 1; and FIG. 9 is a plan view of a printed circuit board component assembly processed by the apparatus according to the embodiment of FIG. 1.

Figure 1:
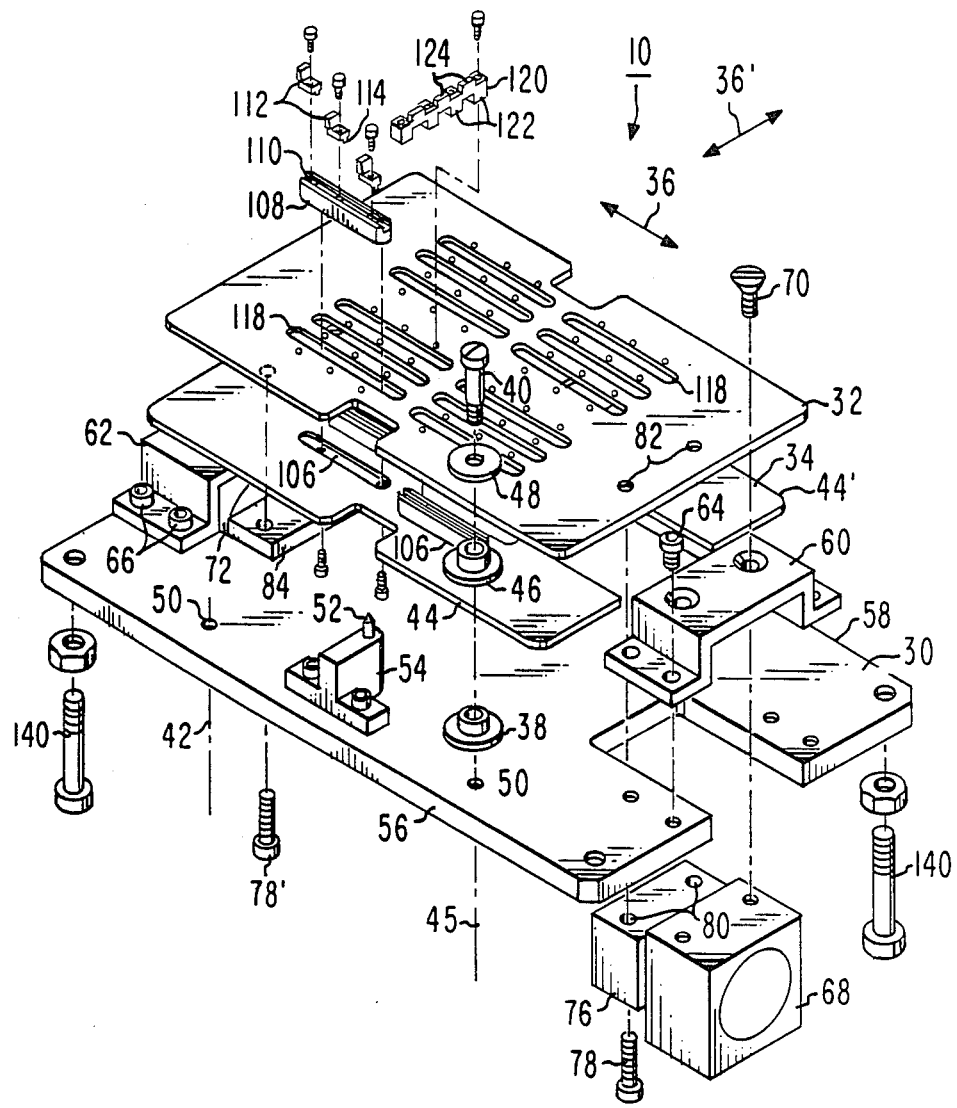
FIG. 1 is an isometric exploded view of an apparatus according to one embodiment of the invention in which only a portion of the lead bending jaws are shown, the apparatus being capable of simultaneously bending the leads of thirty-six components.

In FIG. 1, apparatus 10 bends the leads of a component such as a component 12, FIG. 8, to secure the component to a substrate. Component 12 comprises a potentiometer 14 attached to a thin substrate insulating sheet 16. Component 12 has a set of three sheet metal leads 18 and 18'. Lead 18 is at one end of substrate sheet and a pair of leads 18' are at the other end of sheet 16. Leads 18 and 18' need to be bent over to secure component 12 to a printed circuit board 20, FIG. 9. Circuit board 20 comprises a dielectric substrate divided into modules 21, 22, 23 and 24 separated by dink openings 26. Openings 26 permit the modules to be later separated by fracturing the substrate. Module 21 contains a component array 28 which comprises a 3×3 matrix. Each of the modules 22, 23 and 24 contains an identical array of nine components in a 3×3 matrix. The components, in this implementation, are spaced on one-half inch center-to-center distance in one direction and three-quarters of an inch center-to-center in the orthogonal direction. The apparatus 10, FIG. 1, can simultaneously bend the leads 18, 18', FIG. 8, of all of the components on the printed circuit board 20 in one operation cycle.

Figure 2:
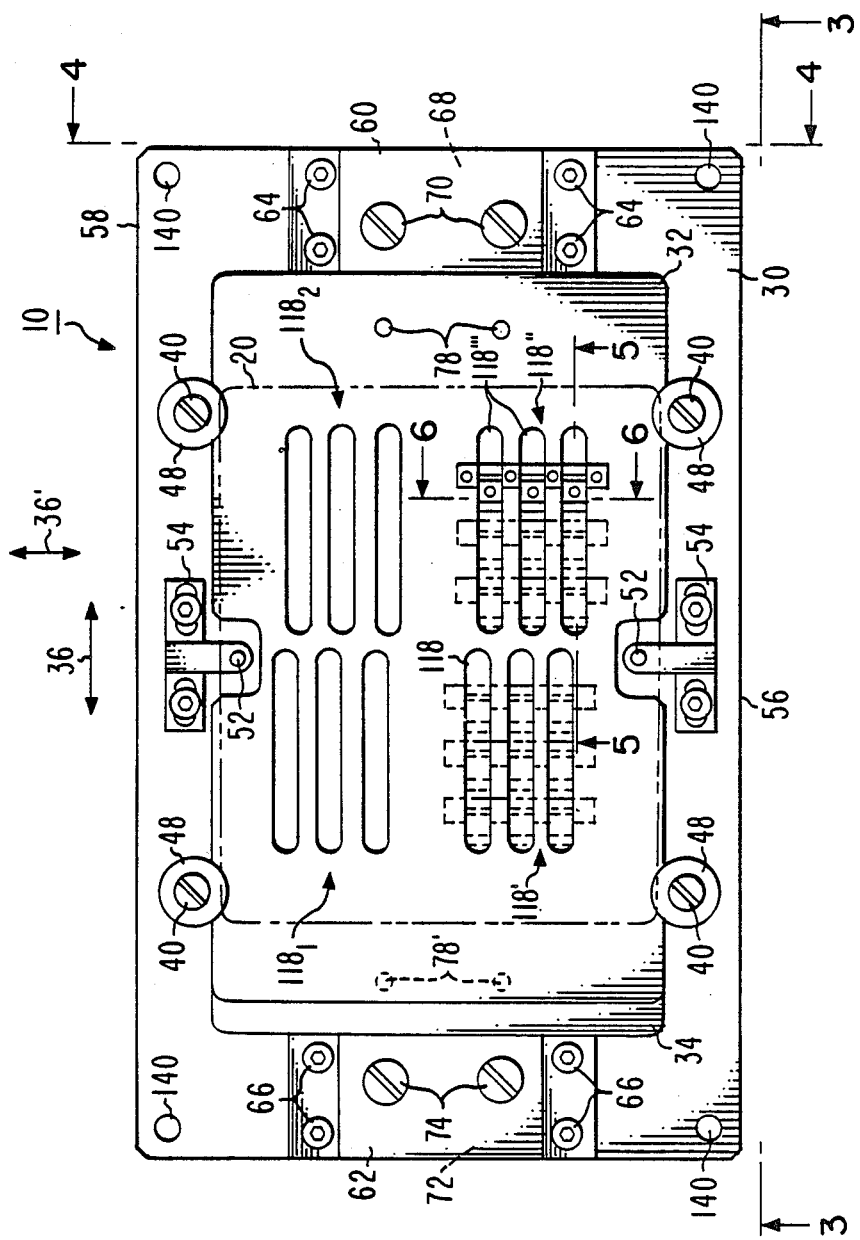
FIG. 2 is a plan view of the apparatus of FIG. 1.

In FIG. 1, apparatus 10 comprises a fixed plate 30 and two parallel moveable plates 32 and 34 which move in directions 36. However, plates 32 and 34 are moved in opposite directions during any given cycle interval. Plate 34 is slidably attached to a set of four pulley-like bearings 38 only one of which is shown in FIG. 1. Bearings 38 are secured between plates 30 and by screws 40 (FIG. 2). A bearing 38 is aligned on each of axes 42 and 45 of plate 34 and a second pair of bearings is aligned on corresponding axes (not shown) for receiving the opposite edge 44' of plate 34. A second set of bearings 46 identical to bearings 38 is located between plates 32 and 34 aligned with each of bearings 38. A bearing disc 48 rests on the upper surface of plate 32. All of the bearings and plates are sandwiched as shown by screws 40 on each of the bearing axes. The screws are threaded to apertures 50 in plate 30. Bearings 38, 46 and disc 48 are of low friction thermoplastic materials to permit smooth sliding of the plates 32 an 34 relative to plate 30 in directions 36.

A printed circuit board locating pin 52 and locating block 54 are secured to plate 30 adjacent edges 56 and 58. Pin 52 and its mating counterpart on the opposite side of plate 30 align printed circuit board 20, FIG. 9, via alignment apertures 60.

In FIGS. 1–4, brackets 60 and 62 are secured to plate 30 by screws 64 and 66, respectively. Air cylinder 68 is attached to bracket 60 by screws 70 (FIG. 2). Air cylinder 72 is secured to bracket 62 by screws 74. Cylinder 68, has a piston 75 which displaces block 76 secured thereto in directions 36. Block 76 is attached to plate 32 by screws 78 via apertures 80 in block 76 and threaded apertures 82 in plate 32, FIG. 1. A block 84 is attached to shaft 86 of cylinder 72 for displacement in directions 36. Block 84 is secured to plate 34 via screws 78. A stop device 88, FIG. 3, sets the maximum stroke length of piston 75 of cylinder 68 and a similar device 90 sets the maximum stroke length of piston 86 of cylinder 72. Devices 88 and 90 are secured to the underside of plate 30 and include respective screws 92 and 94 for making the desired settings.

Control 96 selectively applies pressurized air from a source (not shown) to either of hoses 98 or 100. Hose 98 is coupled to the extension portion of cylinder 68 for displacing block 76 to the left of drawing FIG. 3. Simultaneously therewith, in an analogous manner, hose 102, coupled to the extension portion of cylinders 72 at the opposite end of plate 30, extends piston 86 moving block 84 in the opposite sense as block 76. The blocks 84 and 88 are displaced until they abut respective screws 94 and 92 in a first set of opposite senses.

Figure 3:
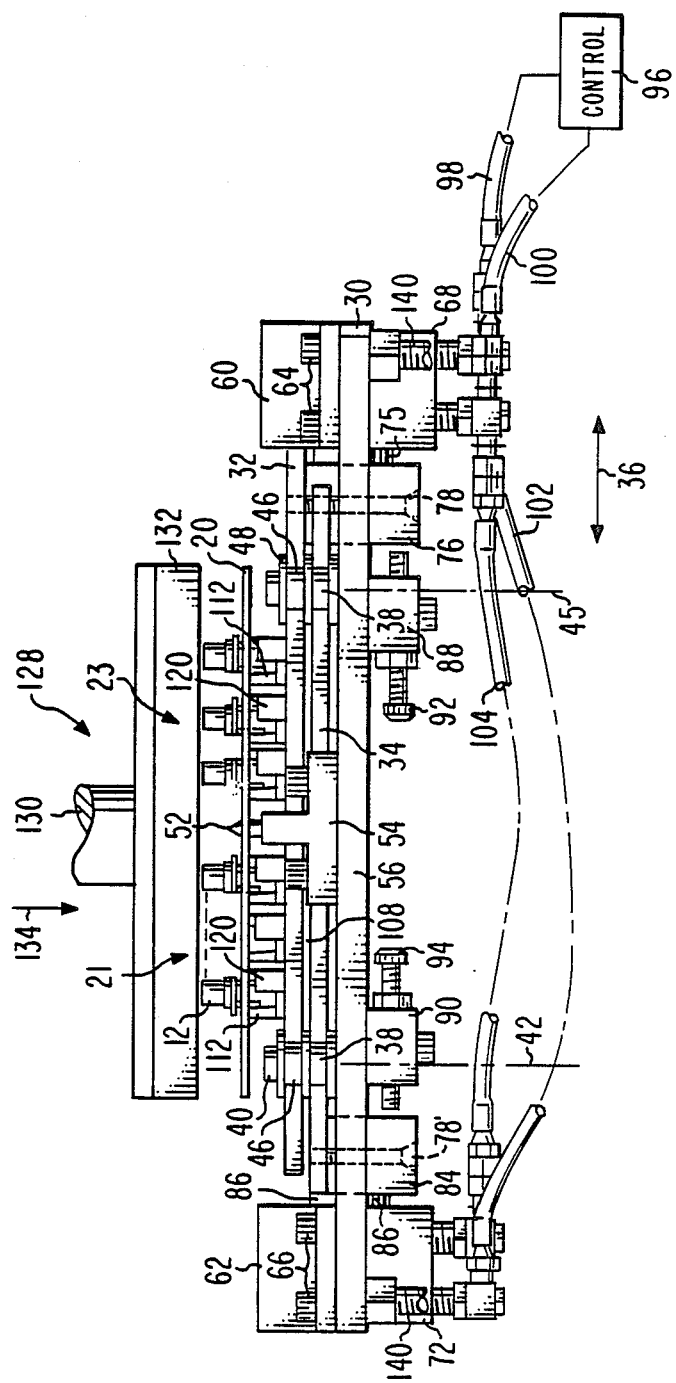
FIG. 3 is a side elevation view of the apparatus of FIG. 2 taken along lines 3—3 illustrating a printed circuit boad and its components and other structure not shown in FIGS. 1 and 2.

Pressurized air in hose 100 is applied to the retract portion of cylinder 68 for displacing block 76 to the right of drawing FIG. 3. Hose 104 is coupled to the retraction portion of cylinder 72 for simultaneously displacing block 84 to the left of the figure in directions 36 in a second set of opposite senses. While the blocks 76 and 84 are displaced simultaneously in this embodiment in each set of displacements, it is to be understood that such simultaneous action is not essential to their function. Displacement of blocks 76 and 84 in directions 36 in first and second sets of senses thus moves the corresponding attached respective plates 32 and 34 in these directions in the same set of senses.

Figure 5:
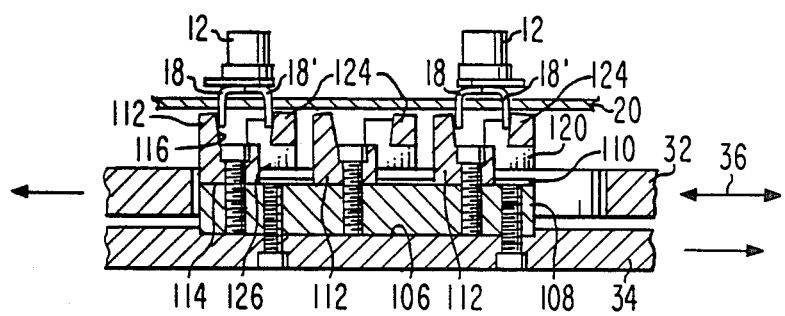
FIG. 5 is a sectional elevation view taken along lines 5—5 of FIG. 2.
Figure 6:
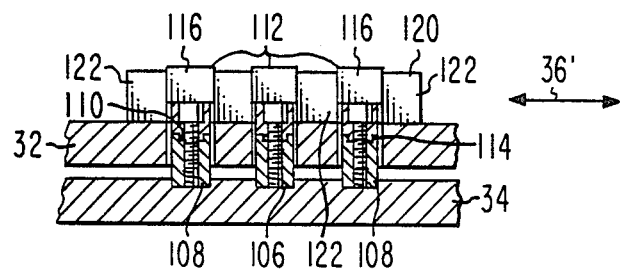
FIG. 6 is a sectional elevation view of the embodiment of FIG. 2 taken along lines 6—6.

In FIGS. 1, 5 and 6, plate 34 includes an array of elongated grooves 106. Each groove 106 of the array extends in directions 36. Secured in each groove 106 is a corresponding rail 108. Rail 108 has an elongated groove 110 in the surface thereof opposite plate 34 to which the rail is attached. Rail 108 is attached centrally in a groove 106.

In FIG. 7, a plurality of L-shaped jaws 112 are screwed to each of rails 108 in spaced relation. Each rail 108 in this embodiment holds three equally-spaced jaws 112 each oriented to face in the same direction. Jaws 112 include a projecting shoulder 114 (FIGS. 5 and 6) which mates with groove 110 in a rail 108 for precluding displacement of the jaw in transverse directions 36'. Each of the jaws 112 has a sufficient width in directions 36' so as to engage either the component 12 single lead 18 or the dual leads 18' (FIG. 8). The jaws 112 each have a planar lead engaging surface 116, substantially normal to directions 36, the surface having a slight taper relative to these directions. There is a separate, different jaw 112 for each component being processed. The grooves 106 and rails 108 are arranged in subarrays of threes on plate 34 for processing the array of nine components in a board module. There are four such subarrays, each subarray containing three rails 108 and nine jaws 112.

In FIG. 1 plate 32 includes an array of elongated openings 118, each corresponding to and receiving a different rail 108. Each opening has a length and width sufficient to permit a corresponding mating rail 108 to be received therein and displaced therein in directions 36 for the full stroke lengths of plates 32 and 34.

Secured to plate 32 are an array of jaw members 120, only one of which is shown in FIG. 1. In this embodiment there are three jaw members 120 for each module 21–24 of the printed circuit board 20 (FIG. 9). The jaw members 120 bridge the rails 108. A typical jaw 120, FIG. 7, has a set of stanchions 122 which are screwed to plate 32. There are three jaws 120 secured to stanchions 122, one jaw 124 between adjacent ones of the stanchions 122. The jaws 124 are raised sufficiently above rails 108 to permit the attaching legs of jaws 112 to pass therebeneath in a bridge-like arrangement. Each jaw member includes a set of three jaws 124 and four stanchions 122. Each jaw 124 has a lead bending surface 126 which faces and cooperates with a jaw lead bending surface 116 of a mating jaw 112. Surface 126 is also slightly tapered relative to directions 36. Thus, as illustrated in FIG. 7, each subarray for processing the component leads of a module of the printed circuit board 20 (FIG. 9) comprises a set of jaws 112 secured to plate 34 and an array of mating jaw members 120 secured to plate 32.

In FIG. 3, component holding structure 128 includes a coupler 130 and a pad 132 made of resilient material, such as foam rubber and similar materials. Structure 128 is displaced downward, direction 134, after printed circuit board 20 is assembled to locating pins 52 via the locating apertures 60 (FIG. 9). The lower surface of board 20 abuts the upper facing surfaces of jaws 112 and 124 which are coplanar. The structure 128 holds the components 12 against the board 20 and the board 20 against the jaws 112 and jaw members 120 during the processing of the component leads.

In operation, each array of jaws 112 and jaw members 120, FIG. 7, are secured in place to correspond to a given printed circuit board module. For example, array 136 may be used for bending the components of module 21, (FIG. 9). The positions of the jaws 112 and 124 are set so as to be closely spaced to the leads of the corresponding components 12 to be bent when the board is resting on the jaws. It does not matter which lead or leads, 18 or 18', are adjacent the different jaws 112 or 124. Each of these jaws 112 and 124 has a sufficient width for bending the single or dual leads.

In FIG. 5, the respective jaws 112 and 124 are adjacent the extended leads 18, 18' of the components 12 prior to bending. This position is set by the location of the jaws where they fasten to the respective plates 32 and 34 with pistons 75 and 86 retracted. In FIG. 3, the screws 90 and 92 of the stop devices 90 and 88 are adjusted to set the maximum stroke length of the cylinders to assure the bending of the leads against the underside of printed circuit board 20. Once a printed circuit board 20 is placed on pins 52, FIG. 3, components 12 are then inserted in the corresponding apertures of the board 20 and project therebeneath adjacent the different jaws.

Holding structure 128 is lowered in direction 134 until the pad 132 engages the components forcing the components and the circuit board against the upper surfaces of the jaws. At this time, control 96, which may be a switch, is activated and supplies pressurized air to extend the jaws in opposite senses, directions 36, to bend the leads. Control 96 then supplies pressurized air to the respective cylinders to reverse the direction of displacement of the jaws to the initial starting position. In this way, the leads of thirty-six components are bent simultaneously in a closely-spaced array. During bending, the jaws become displaced from the lower board surface an amount of about the thickness of the leads being bent.

In FIG. 2, the openings 118 of array 118' in plate 32 are offset from the array 118" of openings 118'". Array 118' corresponds to module 21 of FIG. 9 and the array 118" corresponds to module 23. The jaws corresponding to each of the openings 118 are aligned in directions 36 and each of the openings 118 in a given array 118, 118" and so forth are aligned in directions 36'. It is to be understood that any two openings and the sets of corresponding jaws for those openings need not necessarily be aligned. For example, array 118$_1$ need not be aligned with array 118' in directions 36'. Also, array 118$_2$ need not be aligned with array 118" in directions 36'. It should also be understood that the jaws may be staggered in directions 36 wherein the different openings 118 are not aligned but are offset in directions 36 by increments equivalent to the spacing of one set of jaws. It is apparent that the arrangements of the jaws are to correspond to the component array and may be formed to provide compactly-positioned jaws for processing closely-spaced leads.

The term leads as employed herein and in the claims is intended to include mechanical tabs and is not limited to electrical terminals.

Figure 4:
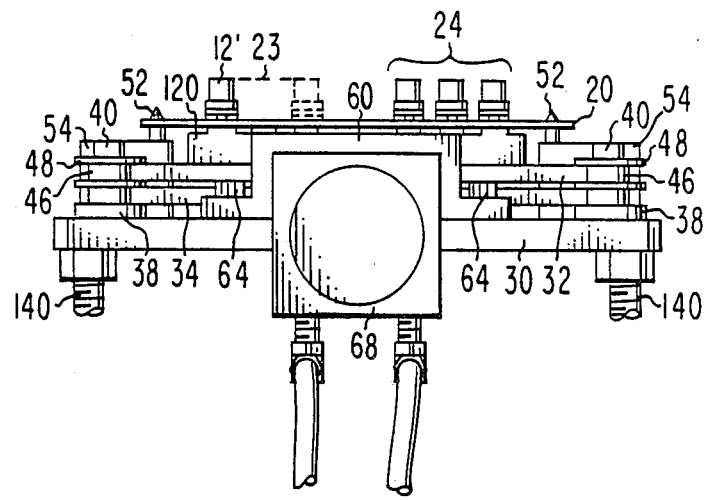
FIG. 4 is an end elevation view of the embodiment of FIG. 2 taken along lines 4—4.

Plate 30, FIGS. 3 and 4, may be secured to a support by an array of screws 140 which adjustably position plate 30 vertically relative to a supporting superstructure (not shown). Other arrangements may be employed for securing the plate 30 to a supporting structure.

What is claimed is:

1. A component lead bending apparatus for bending leads of an array of components on a substrate comprising:
   a support;
   first and second actuating means secured to the support, each actuating means for displacement in given opposite directions relative to said support;
   a first member moveably secured to the support and coupled to the first actuating means for displacement in said given directions in a first set of opposite senses;
   a second member moveably secured to the support between the support and first member and coupled to the second actuating means for displacement in said given directions in a second set of opposite senses opposite the first set;
   a first array of lead bending jaws secured to the first member;
   a second array of lead bending jaws secured to the second member, each jaw of the first array corresponding to and facing a jaw of the second array for bending the leads of a component between said jaws; and
   control means for operating said actuating means to displace said members in said first and second sets of senses.

2. The apparatus of claim 1 wherein each member comprises a planar plate, said first and second arrays of jaws extending aligned in two orthogonal directions one of which is parallel to said given directions.

3. The apparatus of claim 1 wherein said first member has an array of openings therethrough normal to said directions, the first array of jaws including an integral jaw member secured to the first member at first regions interdigitated with said openings, said jaw member forming said first array of jaws at second regions interdigitated with said first regions.

4. The apparatus of claim 3 wherein said second array of jaws are secured to the second member at said first regions and project through corresponding ones of said openings in said facing arrangement with the corresponding ones of the jaws of the first array.

5. The apparatus of claim 4 wherein said openings are formed in a plurality of sets, each set having a corresponding set of aligned first and second arrays of jaws.

6. The apparatus of claim 5 wherein at least two of said sets of openings have separate different alignments relative to said support.

7. The apparatus of claim 1 wherein said first and second members and support each comprise a plate and means for securing the first actuating means to one end of the support plate and means for securing the second actuating means to a second end of the support plate opposite the one end.

8. The apparatus of claim 1 wherein said support includes substrate alignment means for aligning the substrate and its array of components relative to said lead bending jaws.

9. A component lead bending apparatus comprising:
   a support;
   a first plate moveably secured to the support for reciprocation in first directions;
   a second plate moveably secured to the support for reciprocation in said first directions;
   said first plate having an opening therethrough;
   a first jaw secured to the second plate and located in said opening;
   a second jaw secured to the first plate aligned with and facing the first jaw in said first directions; and
   actuating means coupled to said first and second plates and secured to the support for selectively moving said plates and jaws in one of said first directions toward one another and then in directions away from one another.

10. The apparatus of claim 9 wherein said first plate opening is elongated extending in said first directions, a plurality of said first jaws secured to the second plate and located in said opening, a plurality of said second jaws secured to the first plate, each second jaw corresponding to and in cooperation with a different first jaw for bending leads of a plurality of said components in response to said selective movement of said plates.

11. The apparatus of claim 10 wherein said first plate has an array of said elongated openings, the openings of said array extending normal to said directions, a plurality of said first jaws, each secured to the second plate and located adjacent to a separate, corresponding one of said openings, a plurality of said second jaws secured to the first plate, each second jaw aligned with and corresponding to a different first jaw for bending the leads of an array of components in response to said selective movement of said plates.

12. The apparatus of claim 9 wherein said first plate has a plurality of array sets of said openings, said sets being in spaced relation, each said opening extending in said first directions, a plurality of said first jaws secured to its second plate and located in selected ones of said openings, a plurality of said second jaws secured to the first plate, each second jaw being aligned with and corresponding with a separate, different first jaw for bending the leads of a mating component corresponding thereto in response to said selective movement of said plates.

13. A component lead bending apparatus comprising:
a support;
a first plate moveably secured to the support for displacement in given opposite linear directions and having a plurality of elongated spaced openings extending in said given directions;
a second plate moveably secured to the support for displacement in said given opposite linear directions, said second plate being between said support and first plate;
a plurality of elongated jaw support members secured to the second plate, each support member located in a separate, different one of said openings;
a plurality of first jaws secured to each jaw support member and facing in one of said directions;
a plurality of second jaws secured to said first plate, each second jaw being located to cooperate with a different first jaw for bending the leads of a corresponding component; and
actuating means secured to the support and coupled to the first and second plates for selectively moving the plates in opposite directions to first close said first and second jaws in a lead bending mode and then opening the jaws in a release mode.

* * * * *